United States Patent [19]

Schreiber et al.

[11] Patent Number: 5,245,135

[45] Date of Patent: Sep. 14, 1993

[54] STACKABLE HIGH DENSITY INTERCONNECTION MECHANISM (SHIM)

[75] Inventors: Christopher M. Schreiber, Newport Beach; William R. Crumly, Anaheim, both of Calif.

[73] Assignee: Hughes Aircraft Company, Los Angeles, Calif.

[21] Appl. No.: 870,972

[22] Filed: Apr. 20, 1992

[51] Int. Cl.[5] .............................................. H05K 1/00
[52] U.S. Cl. .................................. 174/261; 174/264; 29/831; 361/792
[58] Field of Search ............... 174/255, 259, 261, 262, 174/264, 266; 361/400, 403, 406, 412, 414, 417, 418; 228/180.2; 439/66, 68; 29/831, 852

[56] References Cited

U.S. PATENT DOCUMENTS

| | | | |
|---|---|---|---|
| 3,516,156 | 6/1970 | Sternko | 174/262 X |
| 3,795,047 | 3/1974 | Abolafia et al. | 174/262 X |
| 4,813,129 | 3/1989 | Karnezos | 361/406 X |
| 4,864,722 | 9/1989 | Lazzarini et al. | 361/414 X |
| 4,902,606 | 2/1990 | Patraw | 439/66 X |
| 5,121,299 | 6/1992 | Frankeny et al. | 174/261 X |

Primary Examiner—Leo P. Picard
Assistant Examiner—Trinidad Korka
Attorney, Agent, or Firm—Elizabeth E. Leitereg; Terje Gudmestad; Wanda K. Denson-Low

[57] ABSTRACT

A high density of interconnection sites on a dielectric substrate is provided by producing a laminated assembly with multiple layers of conductors (11, 21) positioned one above the other within the substrate (8). Each conductor (11, 21) terminates at a raised feature (12, 22) projecting beyond the surface of the substrate (8) for connection in an electrical circuit. This permits the conductors (11, 21) to be positioned in the same plane perpendicular to the substrate (8) so that two rows of termination pads (12, 22) may be provided without leaving space between the pads of one for the conductors of the other. Efficient, high speed impedance matching may be accomplished by the addition of a grounding conductor (26) between two signal layers of circuitry within the substrate, also provided with raised features (27) extending to the exterior of the substrate (8).

10 Claims, 2 Drawing Sheets

STACKABLE HIGH DENSITY INTERCONNECTION MECHANISM (SHIM)

BACKGROUND OF THE INVENTION

1. Field of the Invention

This invention relates to electrical conductors within a substrate which terminate at raised features, and in particular to an arrangement for increasing the density of raised features at the termination site.

2. Description of Related Art

Electrical circuits may be constructed in which a conductor is positioned within a dielectric substrate and terminates at a raised feature which projects beyond the surface of the substrate and is supported by a pad. This provides a means for connection to another electrical component or circuit. A typical circuit assembly, such as a flex circuit or a printed circuit board, will include a multiplicity of such conductors, each with a projecting raised feature at its terminal side. In order to provide enough space for the pads of the raised features, it has been necessary to fan out the conductors at the termination site. Typically, there will be two rows of raised features with the conductors of one row extending between the adjacent raised feature pads of the other row in order to reach the raised features of the former. This spreads out the termination site and results in a relatively low density of contact pads because of the space necessary for the conductors of one row to extend between the pads of the other. When conductors are routed from one side, this limits density to around 60 termination pads per linear inch, that is, two rows of about 30 pads each. This is undesirable in high speed devices in which signal integrity is essential.

SUMMARY OF THE INVENTION

The present invention provides an arrangement by which the density of the contact pads may be increased by around 50%. The result is an interconnection arrangement fully suitable in the advanced microprocessor field and for low-cost impedance matched interconnections and cables on any board-to-board or board-to-device communications.

This is accomplished by providing a circuit assembly in which there are two or more rows of conductors positioned one above the other within a dielectric substrate. Each conductor terminates in a raised feature that projects beyond the surface of the substrate for connection in a circuit. The conductors in one row are superimposed over the conductors of the other row and separated by a portion of the substrate. The conductors in the bottom row thus extend beneath and beyond the conductors in the top row, underneath the raised features of the conductors of the top row. A ground conductor may be provided for the purpose of signal isolation or impedance matching between the two sets of conductors, with the raised features of the bottom row of conductors extending upwardly through openings in the ground to project beyond the upper surface of the substrate. The ground also may include raised features which extend above the upper surface of the substrate.

In creating the circuit assembly of this invention, subassemblies are provided which are laminated together. These may be produced following the techniques of patent application Ser. No. 07/580,758 for THREE-DIMENSIONAL ELECTROFORMED CIRCUITRY, filed Sep. 11, 1990, by William R. Crumly, Christopher M. Schreiber and Haim Feigenbaum. This application is assigned to the assignee of the present application. The disclosure of this prior application is incorporated by reference as though fully set forth herein.

One subassembly will include at least one conductor laminated to a dielectric film, with a coverlay over its outer surface. The conductor terminates at a raised feature. The second subassembly is similar, but does not include the coverlay. The raised feature of the second subassembly is higher than that of the first subassembly. A third subassembly also is produced. This includes a planar conductor that acts as a ground in the final circuit assembly. Raised features are provided on this conductor, being intermediate the heights of the raised features of the other two subassemblies.

The three subassemblies then are put together with the first and second subassemblies in the outside and the third subassembly in between.

Openings are provided in the first subassembly that receive the raised features of the second and third subassemblies. The third or intermediate subassembly includes an opening through which the raised feature of the second subassembly extends. A clearance is provided at the opening in the ground conductor to avoid a short circuit. When assembled in this manner, the lamination is subjected to heat and pressure to bond the components together, resulting in a completed circuit unit.

DESCRIPTION OF THE PREFERRED EMBODIMENTS

Figure 1:
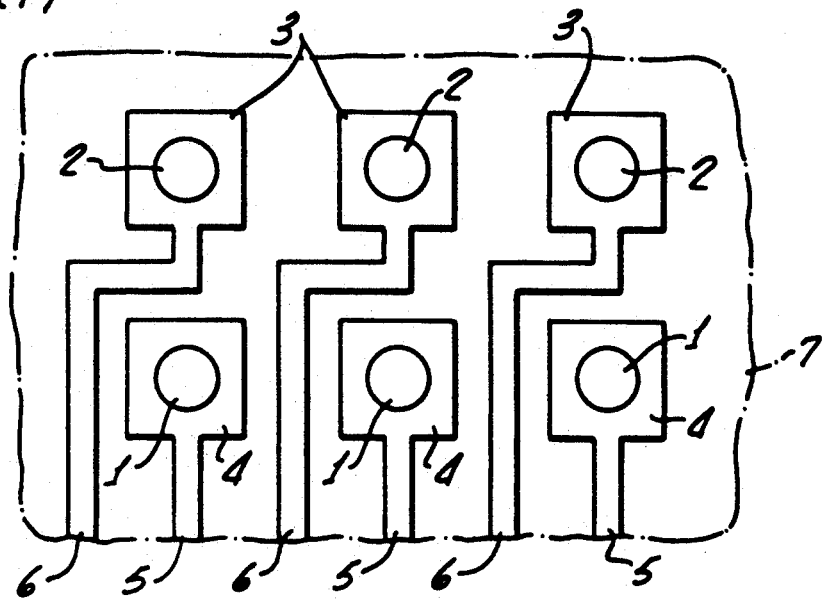
FIG. 1 is a fragmentary plan view of the termination site of prior art circuitry.

As shown in FIG. 1, prior art circuitry typically will include two parallel rows of identical dots or raised features 1 and 2 projecting from pads 3 and 4, respectively, which support the raised features. Conductors 5 connect to the raised features 1, with other conductors 6 extending to the raised features 2. The ends of the raised features 1 and 2 project beyond the surface of a dielectric substrate 7 (shown in phantom) while the conductors 5 and 6 are buried within the substrate. The conductors are all in the same plane. In order to reach the raised features 2 in the outer row it is necessary to route the conductors 6 between adjacent raised features 1. Obviously, this requires extra space between the raised features to provide clearance for the conductors 6.

Figure 2:
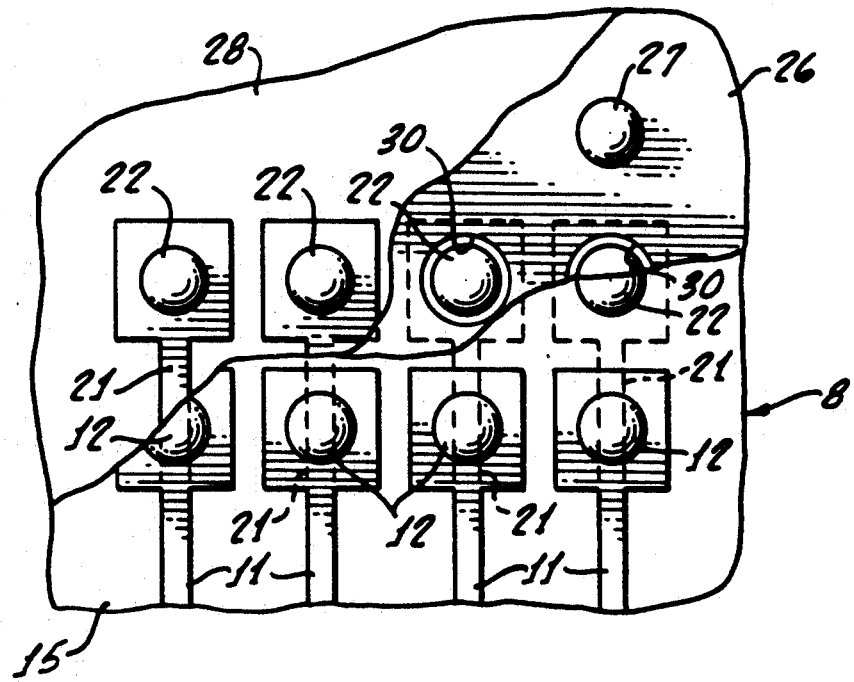
FIG. 2 is a fragmentary plan view, partially broken away, of a circuit made in accordance with the present invention.

FIG. 2 illustrates the much closer spacing possible for raised features 12, 22 and 27 by positioning their associated conductors in different planes within the substrate 8, as explained below.

Figure 3:
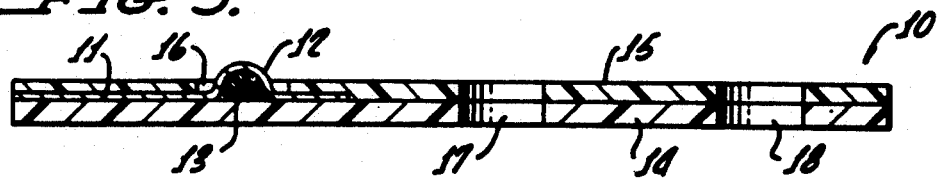
FIGS. 3, 4 and 5 are enlarged sectional views of the three subassemblies that make up the circuit.

In achieving the increased density of raised features, a circuit subassembly 10 first is produced according to the procedure of either of the aforementioned patent applications, which includes a copper circuit trace 11 which is electroplated on the surface of a mandrel in a pattern defined by a photoresist, not shown. As seen in FIG. 3, the linear circuit trace 11 terminates at a raised feature 12 which is plated into a recess in the mandrel. A filler 13 of a material such as epoxy may be applied to the interior of the raised feature to increase its strength. A dielectric substrate 14, which may be a polyamide such as Kapton coated with an acrylic adhesive, is laminated to the underside of the circuit trace 11 and the raised feature 12. The dielectric substrate 14 is considerably wider than the circuit trace 11. Normally, the substrate 14 is flat with several parallel circuit traces 11 positioned along the substrate. A coverlay 15 is laminated to the opposite side of the assembly 10, being provided with an opening 16 through which the raised feature 12 projects. Two additional openings 17 and 18 extend through the substrate 14 and coverlay 15 beyond the raised feature 12 and aligned with the circuit trace 11. These are to accommodate raised features from other subassemblies, as will be explained below. The openings 17 and 18 may be predrilled in both the substrate and the coverlay.

Figure 5:
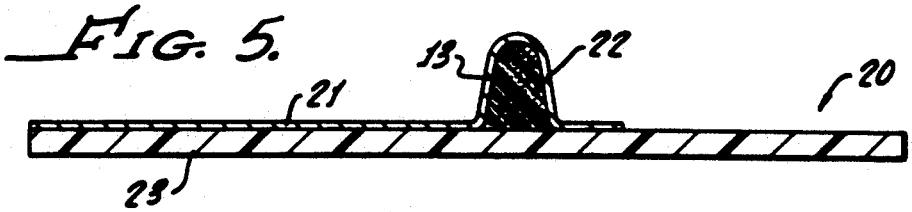

A second circuit subassembly 20 (FIG. 5) is formed in a similar manner. This includes a linear circuit trace 21 with a raised feature 22 which is of somewhat greater height than the raised feature 12 of the other circuit assembly 10. A dielectric substrate 23 of similar dimension to the substrate 14 is laminated to the underside of the circuit trace 21 and the raised feature 22. No openings are formed through the subassembly 20.

Figure 4:
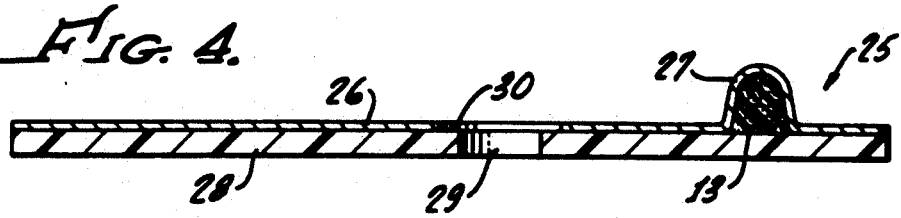

A third subassembly 25, as shown in FIG. 4, is produced by the technique used for the other two. In this instance, the conductor 26 is in the form of a flat sheet, rather than a narrow linear trace as in the other subassemblies. A raised feature 27 projects outwardly from one side of the conductor 26. A dielectric substrate 28 is laminated to the opposite side of the planar conductor 26, on the underside of the raised feature 27. One opening extends through the substrate 28 and is axially aligned with a larger opening 30 through the conductor 26. The raised feature 27 is higher than the raised feature 12 of the subassembly 10, but not as high as the raised feature 22 of the other subassembly 20. The spacing between the longitudinal center of the raised feature 27 and the axes of the openings 29 and 30 is the same as that between the axes of the openings 17 and 18 of the subassembly 10.

Figure 6:
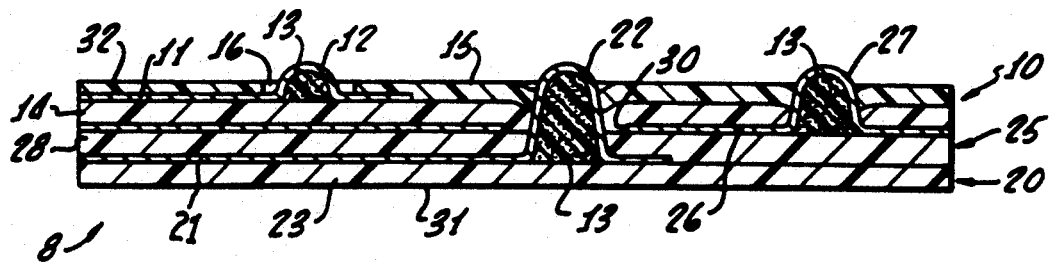
FIG. 6 is a sectional view of the circuit with the subassemblies put together to form a unitary lamination.

The laminated assembly of FIG. 6 then is produced, consisting of the subassemblies 10 and 20 on the outside with the subassembly 25 in between. The circuit trace 21 of the subassembly 20 is positioned directly opposite from the circuit trace 11 of the subassembly 10 and is adjacent the bottom surface 31 of the assembly. In other words, the circuit trace 11 is superimposed upon the circuit trace 21 but spaced from it. The opening 17 of the subassembly 10 is aligned with the openings 29 and 30 of the subassembly 25. The raised feature 22 of the subassembly 20 is extended through these openings to project beyond the coverlay 15. There is clearance between the raised feature 22 and the edge of the opening 30 in the conductor 26 avoiding contact at that location.

The raised feature 27 of the subassembly 25 extends through the opening 18 and also projects beyond the coverlay 15.

The assembly thus produced is subjected to heat and pressure, causing the dielectric layers to fuse into the unitary lamination 8. The result is a completed circuit assembly with three raised features all projecting outwardly the same distance beyond the upper surface 32 (which is parallel to the lower surface 31), but originating at three different levels in the lamination. The tips of three raised features fall in the same plane perpendicular to the lamination, which is also the plane that includes the circuit traces 11 and 21. The base of each raised feature is within the substrate 8. Inasmuch as the conductors 11, 21 and 26 are at different levels in the lamination, the raised features may be located close to each other and no space is needed to permit a conductor to extend past a pad.

Not all circuits require the ground layer 26. Various numbers of superimposed conductors may be included in an assembly.

While only three layers of conductors have been described here, it is apparent that more layers of conductors can be positioned with raised features extending above the surface simply by extending the height of the raised features on the additional layers and providing openings in the other layers to accommodate the raised features from the additional layers.

What is claimed is:

1. A circuit assembly having a unitary laminated dielectric body with opposite first and second surfaces comprising:
   at least one first circuit subassembly comprising:
      a first conductor,
      a first raised conductive feature connected to a terminal end of said first conductor, said first raised feature having an outer end extending outwardly beyond said first surface of said laminated dielectric body,
      a first dielectric substrate laminated to one side of said first conductor and to an end opposite said outer end of said first raised feature, said first dielectric substrate having openings therethrough, and
      a dielectric coverlay laminated to an opposite side of said first conductor, said coverlay having openings therethrough, one of said openings for receiving said first raised feature, said coverlay being adjacent said first surface of said laminated dielectric body, and
   at least one second circuit subassembly comprising:
      a second conductor,
      a second raised conductive feature connected to a terminal end of said second conductor, said second raised feature of said second circuit subassembly having an outer end which is sufficiently raised to extend outwardly through an opening in said first dielectric substrate through another opening in said coverlay and beyond said first surface of said laminated dielectric body, and
      a second dielectric substrate laminated to one side of said second conductor and to an end opposite said outer end of said second raised feature, said second dielectric substrate being adjacent said second surface of said laminated dielectric body,
   wherein said first and said second subassemblies are placed in a stacked relationship such that said first dielectric substrate is adjacent said second conductor and said first conductor is substantially superimposed upon and positioned in a plane defined by said first dielectric substrate different from a plane defined by said second dielectric substrate of said second conductor,
   whereby said raised features of said first and said second circuit subassemblies can be positioned in closely spaced adjacency.

2. A device as recited in claim 1 further comprising a third circuit subassembly, said third circuit subassembly comprising:
a third conductor,
a third raised feature, said third raised feature having an outer end extending outwardly beyond said first surface of said laminated dielectric body, and
a dielectric substrate laminated to one side of said third conductor and an end opposite to said outer end of said third raised feature, said third dielectric substrate having openings therethrough for receiving said second raised feature of said second circuit subassembly,
wherein said third circuit subassembly is positioned between said first and said second circuit subassemblies such that said third conductor is intermediate said first and said second conductors and in a plane defined by said third dielectric substrate different from said planes of said conductors of said first and second circuit subassemblies, and
wherein said third raised feature extends through respective openings in said first dielectric substrate and said coverlay such that said third raised feature is in closely spaced adjacency with said first and said second raised features.

3. A device as recited in claim 1 including a planar conductive member in said dielectric body for acting as a ground, said planar conductive member being positioned in said dielectric body between said first and second circuit subassemblies, and having a clearance opening through which said raised feature of said second circuit subassembly projects.

4. A device as recited in claim 3 including a third raised feature connected to said planar conductive member, said third raised feature having an outer end spaced outwardly beyond said first surface.

5. A device as recited in claim 1 in which said first and second surfaces of said dielectric body are parallel, said first and said second conductors are elongated and fall substantially in a plane parallel to said first and said second surfaces and in which said first and said second raised features fall substantially in a plane perpendicular to said first and second surfaces.

6. A device as recited in claim 2 in which said outer ends of said first, said second and said third raised features are spaced an equal distance outwardly of said first surface of said dielectric body such that electrical connections can be made to said first, said second and said third raised features.

7. A method of providing a circuit assembly comprising the steps of
forming a first subassembly which includes a first conductor and a first dielectric substrate such that said first conductor includes a raised feature projecting outwardly beyond a surface of said first dielectric substrate,
forming a second subassembly of a second conductor and a second dielectric substrate such that said second conductor includes a second raised feature of greater height than said raised feature of said first conductor, and said second raised feature projects outwardly beyond a surface of said second dielectric substrate,
forming an opening in said first dielectric substrate adjacent and spaced from said raised feature of said first conductor,
placing said first subassembly and said second subassembly in adjacency so that said second raised feature extends through said opening in said first dielectric substrate and projects outwardly beyond said surface of said first dielectric substrate while said second conductor is positioned in a different plane from that of said first conductor, and
laminating said first and second subassemblies into a unit to form a unitary circuit assembly.

8. The method as recited in claim 7 in which said first conductor is superimposed over said second raised feature.

9. The method as recited in claim 7 including the steps of forming a third subassembly which includes a third conductor and a third dielectric substrate such that said third conductor includes a third raised feature projecting outwardly from said third dielectric substrate and is of a height intermediate the heights of said first and second raised features, forming an opening in said third dielectric substrate, forming an additional opening in said first dielectric substrate, and, before laminating said first and second subassemblies into a unit, positioning said third subassembly between said first and second subassemblies so that said third raised feature extends through said additional opening in said first dielectric substrate and projects outwardly beyond said surface of said first dielectric substrate, and said second raised feature extends through said opening in said third dielectric substrate, whereby said third subassembly becomes laminated into said unit with said first and second subassemblies and becomes part of said unitary circuit assembly.

10. The method as recited in claim 9 in which said third conductor is made planar so as to have substantially greater lateral dimension than said first and second conductors, an opening is formed in said third conductor to form a continuation of said opening in said third dielectric substrate, and said second raised feature is extended through said opening in said third conductor, said opening in said third conductor being made sufficiently large to provide a clearance around said second conductor.

* * * * *